United States Patent

[11] 3,590,344

[72] Inventors John S. Roberts
Export;
Daniel R. Muss, Pittsburgh, both of, Pa.
[21] Appl. No. 834,997
[22] Filed June 20, 1969
[45] Patented June 29, 1971
[73] Assignee Westinghouse Electric Corporation
Pittsburgh, Pa.

[54] LIGHT ACTIVATED SEMICONDUCTOR CONTROLLED RECTIFIER

9 Claims, 5 Drawing Figs.

[52] U.S. Cl. .......... 317/235, 250/211, 307/305
[51] Int. Cl. .......... H01l 11/10
[50] Field of Search .......... 317/235

[56] References Cited

UNITED STATES PATENTS

| | | | |
|---|---|---|---|
| 3,435,305 | 3/1969 | Lutz | 317/235 |
| 3,317,746 | 5/1967 | Hutson | 307/88.5 |
| 3,422,323 | 1/1969 | Whoriskey | 317/235 |
| 3,487,223 | 12/1969 | St. John | 250/216 |
| 3,444,381 | 5/1969 | Wendland | 250/211 |

*Primary Examiner*—John W. Huckert
*Assistant Examiner*—Martin H. Edlow
*Attorneys*—F. Shapoe and C. L. Menzemer

ABSTRACT: This disclosure is concerned with a four region light activated controlled rectifier. The controlled rectifier, which comprises in part a body of silicon having four alternate regions of opposite type conductivity, the two end regions being emitter regions and two middle regions being base regions, is "turned-on" by light. The light enters at one major surface of the body passes entirely through the body to the opposed major surface where reflective means causes the light to pass back through the body. The reflection of the light causes the rectifier to be "turned-on" faster than possible with prior art devices.

WITNESSES:

Bernard R. Giegucz

James F. Young

INVENTORS
Daniel R. Muss and
John S. Roberts.
BY
C. L. Menzemer
ATTORNEY

LIGHT ACTIVATED SEMICONDUCTOR CONTROLLED RECTIFIER

BACKGROUND OF THE INVENTION

1. Field of the Invention

This invention is in the field of light activated semiconductor devices.

2. Description of the Prior Art

The present design of light activated semiconductor devices, and in particular light activated switches or controlled rectifiers involves a compromise between effective heat sinking, sufficient electrical contact area, and sufficient optical contact area.

In the absence of an electrical contacting material which would be transparent to the activating radiation or light, the surface of the body of semiconductor material, for example, silicon, through which the activating light enters cannot be electrically contacted. Consequently, the light can only enter the body of silicon over a relatively small area and lateral current flow must take place before the entire body is "turned on."

A typical prior art device 8 is shown in FIG. 1. The light activate device 8 of FIG. 1 is a four region switch and is comprised of a body of silicon 10 having a P-type anode emitter region 12, an N-type base region 14, a P-type base region 16 and an N-type cathode emitter region 18. The device 8 includes two power terminals 28 and 33 adapted for connection to a source of electrical power, not shown. In the particular embodiment shown the lower terminal 28, preferably formed from copper or some other similar material of high electrical conductivity, has a flat portion 30 on which the lower anode emitter region 12 is bonded. Extending downwardly from the flat portion 30 is a threaded stud portion 32 adapted for connection to a heat sink or the like.

The upper terminal 33 comprises an elongated column, also of copper or some other material of high electrical conductivity, and has a lower flattened portion 34 which rests on the upper surface of the body 10 and is bonded to the cathode emitter region 18. Surrounding the body 10 and hermetically sealed to the terminals 28 and 33 is a cup-shaped ceramic insulator 36.

The assembly described thus far is similar in construction to a conventional four-region switch, except that the gate lead found in pulse gated devices is eliminated. Instead of a conventional gate lead, this type of device has an internal bore member disposed in the upper power terminal 33; and the upper end of the bore 38 is connected through a light pipe 40, preferably butted against the surface of the cathode emitter, to a source of light energy, typically a gallium arsenide laser diode, or laser diode stack 42. The light generated by the laser diode 42 is conducted through the light pipe 40 directly onto an unmetallized area on the upper surface of the cathode emitter region 18. The device is thus optically triggered by having the light, schematically illustrated by the arrows 44, pass through the cathode emitter region 18 and into the P-type base region 16 and to some extent; in the N-type base region 14.

As illustrated by the arrows 44, the light introduced into the body 10 passes through the body 10 in a relatively straight path with little or no lateral spreading.

The time for a relatively large area device of this type to be completely turned on can be as high as 40 microseconds and is usually from 10 to 20 microseconds in most power devices.

While this is a slow complete turnon time compared to the device of the present invention, it should be pointed out that this is a considerably faster complete "turnon" time than can be realized with a conventional gated device.

An object of this invention is to provide a light activated controlled rectifier or switch which has a fast complete "turnon" time.

Another object of the present invention is to provide a light activated controlled rectifier having internal means for reflecting the activating light throughout the device whereby the complete turnon time of the device is greatly reduced.

Other objects will, in part, be obvious and will, in part, appear hereinafter.

SUMMARY OF THE INVENTION

In accordance with the present invention and attainment of the foregoing objects there is provided a semiconductor device comprising a body of semiconductive material having four regions of alternate type conductivity, a PN junction between each region, the two regions at opposite ends of the body comprising emitter regions for the device, at least one of the emitters projecting into a flat surface of the body, the two intermediate regions between the emitter regions comprising base regions for the device, means for directing light energy onto a portion of said flat surface of the at least one emitter to initiate conduction through the device, at least some of the light energy being of a wavelength which will pass entirely through the four regions of the body, and reflective means disposed on a surface of the body which is substantially parallel to said flat surface, whereby the light energy reaching said surface is reflected back into the body of semiconductor material.

DESCRIPTION OF DRAWING

For a better understanding of the nature and objects of the invention, reference should be had to the following detailed description and drawing in which.

DESCRIPTION OF PREFERRED EMBODIMENTS

Figure 2:
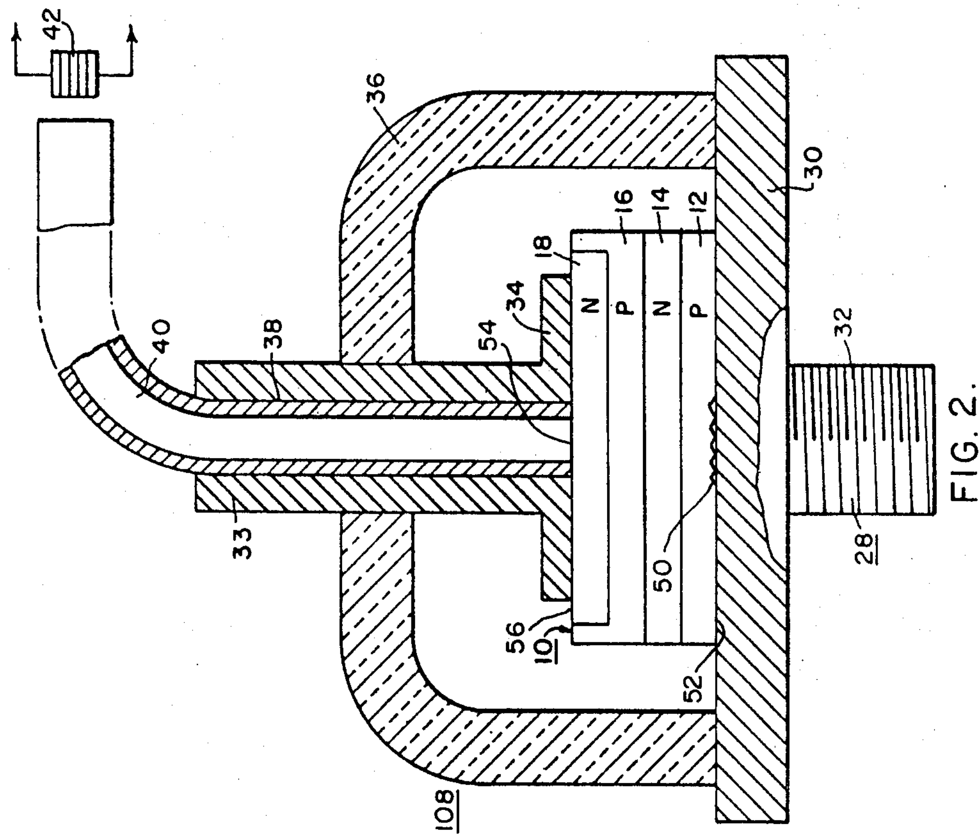
FIG. 2 is a side view of a light activated device incorporating the teachings of this invention.

With reference to FIG. 2 there is shown a light activated semiconductor 108 embodying the teachings of the invention. Specifically device 108 is a four region switch.

Figure 1:
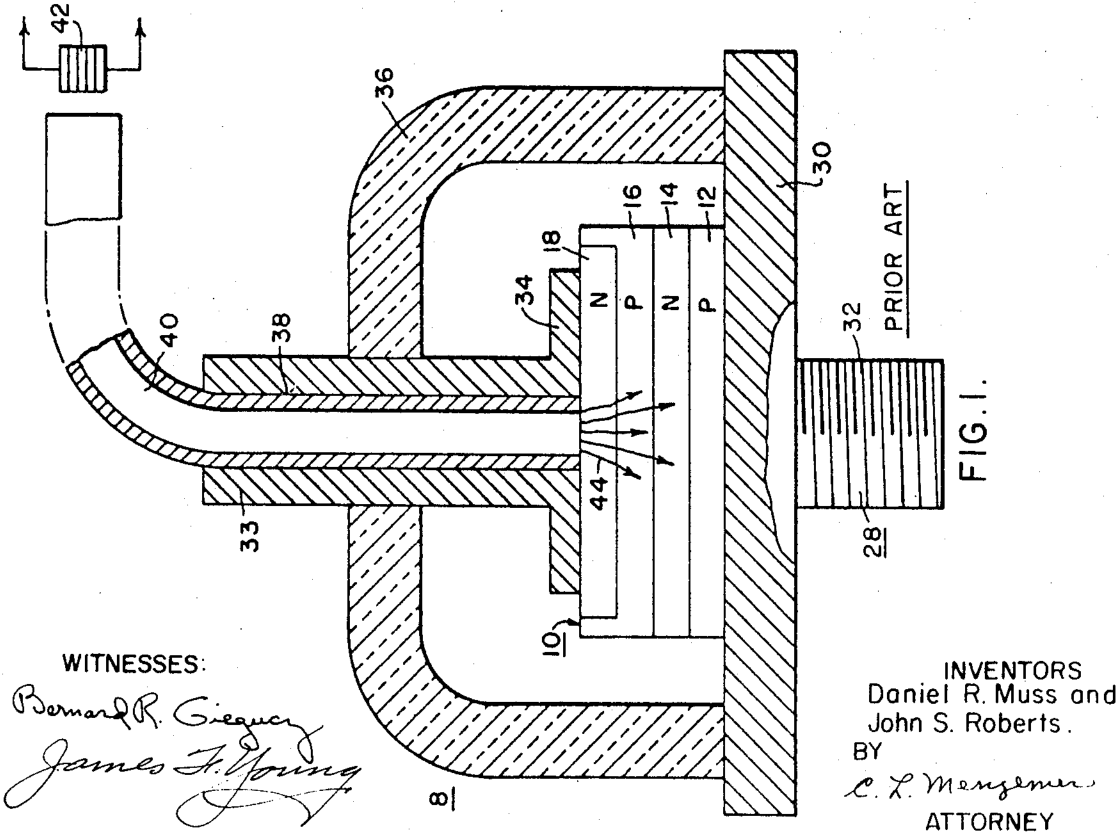
PRIOR ART FIG. 1.
FIG. 1 is a side view of a typical prior art light activated device.

The device 108 of FIG. 2 resembles the prior art device 8 of FIG. 1 and all like features have the same designation as those used in FIG. 1.

The inventive feature set forth in FIG. 2, and not found in prior art devices, is the introduction of reflective means 50 on surface 52 of the body 10 directly below area 54 on surface 56 of wafer 10. Area 54 on surface 56 is where activating light is introduced into the body 10. The reflective means 50 of FIG. 2 is a series of grooves formed in surface 50 of body 10. The reflection means 50 in conjunction with radiation which penetrates deep inside the semiconductor material provides rapid complete "turnon" of the device. The radiation strikes the reflective means, grooves 50 and is reflected into the area of body 10 shielded from the direct radiation by portion 34 of power terminal 33. The remote area of the device is thus activated without waiting for lateral spreading from the activated regions to occur.

In addition to reducing complete "turnon" time of the device, devices made in accordance with the teachings of this invention have extremely high $dI/dT$ at high peak currents.

Figure 3:
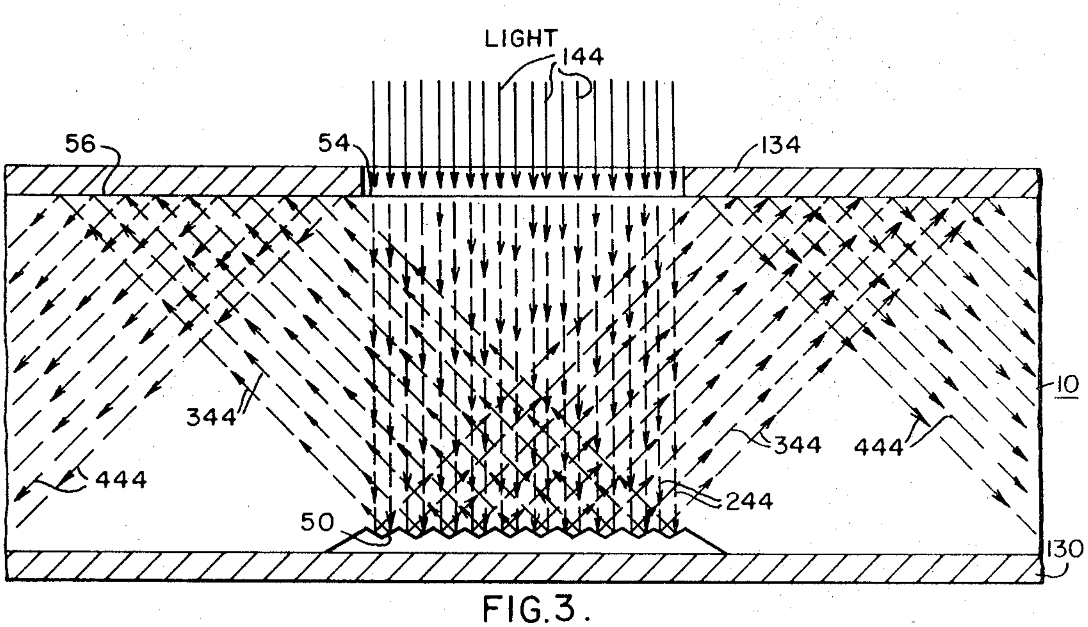
FIG. 3 is a side view of the body 10 of semiconductor material of FIG. 2.

With reference to FIG. 3, there is shown a greatly enlarged view of the body 10 of semiconductor material of FIG. 2. The body 10 is shown in FIG. 3 with aluminum electrical contacts 130 and 134 affixed thereto.

As shown in FIG. 3, light energy indicated by arrows 144 strikes area 54 on surface 56 of body 10. The light being of an intensity and wavelength such that at least a portion of it will completely penetrate the body 10, passes through the body 10 from surface 56 to surface 52, indicated by arrows 244, where it strikes grooves 50, and is reflected at an angle back toward surface 56 indicated by arrows 344. Because of the angle of the grooves 50, the light is reflected toward that portion of surface 56 covered by contact 134. When the light strikes the surface 56 it is again reflected back toward surface 52, indicated by arrows 444. Thus, the entire body 10 is essentially simultaneously completely activated, completely "turned-on" by the light without any delay while lateral current flow takes place.

The proper operation of a device made in accordance with the teachings of this invention is dependent upon selecting a radiation or light source of sufficient intensity and having the proper wavelength and forming grooves at the proper angle from the horizontal to ensure the desired reflection.

One satisfactory radiation or light source for use with a device of this invention is a neodymium doped rod laser. Suitable rod lasers are glass lasers, yttrium-aluminum-garnet lasers and calcium-fluorophosphate lasers.

The radiation from a neodymium doped rod laser has a wavelength of about 1.06$\mu$. The characteristic absorption depth of this radiation in silicon is between 300 and 500 microns. Consequently, the radiation from a neodymium doped laser is attenuated by 67percent passing through a thickness of from 300 to 500 microns of silicon. Power semiconductor devices are comprised of a body of silicon which typically vary in thickness from 125 microns to 375 microns. Thus it is obvious, given a beam with sufficient energy, the radiation can pass through a body thickness several times and still generate in each pass a sufficient number of hole-electron pairs to actuate essentially all of the body.

In choosing the angle of the reflecting concentric grooves shown in FIGS. 2 and 3 several factors must be considered. First, one has the choice of making the grooves and the surfaces beneath the electrical contacts highly reflective by polishing and metallic deposition, or an angle can be chosen such that the critical angle for the semiconductor is exceeded for the radiation wavelength used. The refractive index for silicon for wavelengths in spectrum suitable for use is about 3.5. Thus the critical angle is about 16.5° to 17°. Any time the radiation is incident on a silicon surface from within the crystal at an angle greater than 17° to the normal of the surface, the radiation will be totally reflected.

Reflection of the radiation by the surface under the electrical contacts is excellent if aluminum is evaporated onto the surface of the silicon body and then sintered at about 500° C. for 20 minutes.

While 16.5° to 17° grooves are satisfactory, the preferred surface angle for any given device will depend on the diameter of the light opening and the overall area and thickness of the body to be activated.

Figure 4:
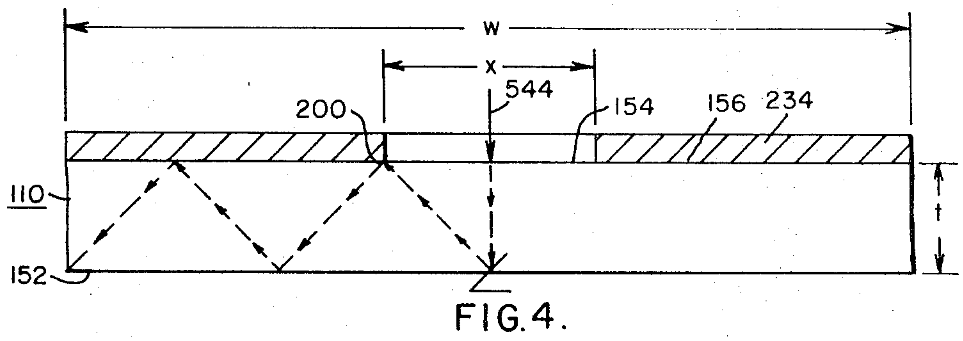
FIG. 4 is a schematic showing of light reflection in a body of semiconductor material.

For example, and with reference to FIG. 4, assuming a body of silicon 10 having a thickness "$t$," a diameter "$W$," an aluminum contact 234 covers all but an area having a diameter $x$ on top surface 156 on body 110. If one assumes a single light beam indicated by arrow 544 of suitable energy and wavelength enters the body at the midpoint of the diameter $x$, travels entirely through the thickness "$t$" of the body 10, the most satisfactory angle for the groove it would strike on bottom surface 152 of body 10 is an angle that would reflect the light beam to point 200 which is just at the edge of the contact 234. The desired groove angle then equals one-half of the angle whose tangent" equals $x/t$. The light beam on striking the surface 156 would again be reflected to surface 152 and in turn be reflected to surface 156. The reflecting process is repeated until the beam is reflected through the body 10. Light beams entering the body 10 on all sides of beam 544 are also reflected throughout the body substantially parallel to beam 544 as shown in FIG. 3.

In a typical controlled rectifier $t$ equals 10 mils; W equals 100 mils; $x$ equals 50 mils and angle alpha would equal 39°.

Figure 5:
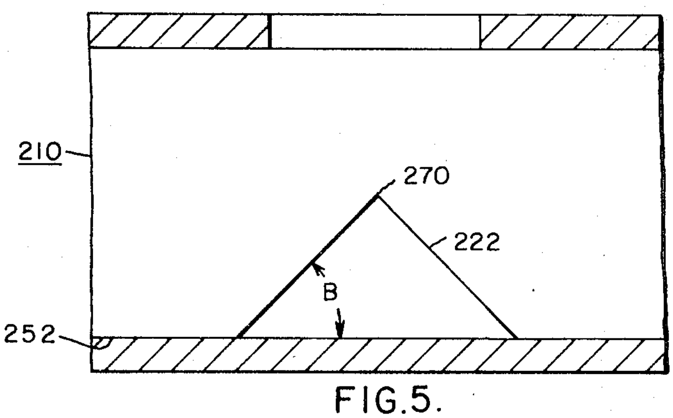
FIG. 5 shows a second embodiment of a body of semiconductor material suitable for use in accordance with the teachings of this invention.

With reference to FIG. 5, in another embodiment of the teachings of this invention a single groove may be formed in bottom surface 252 of body 210 of silicon to serve as the reflective means. However, this embodiment is less desirable because the angle B must be so large that apex 270 of the groove extends too far into the body 210 and the PN junction between at least the two bottom regions would be exposed along edges 222 of the groove. The exposed PN junction would have to be passivated to ensure the electrical stability of the device.

Semiconductor devices embodying the teachings of this invention are capable of instantaneous complete "turnon."

We claim as our invention:

1. A semiconductor device having top and bottom opposed major surfaces comprising: (1) a body of semiconductor material having top and bottom opposed major surfaces, said body having four regions of alternate type conductivity disposed alternately between said top surface and said bottom surface, a PN junction between adjacent regions, the regions at the opposed major surfaces being emitter regions and the two intermediate regions being base regions, (2) a metal electrical contact disposed about the periphery of one of the major surfaces and covering less than the total area of the surface, (3) a second metal electrical contact disposed on the other major surface of the body, means for directing light energy onto one of said major surfaces to initiate conduction through the device, at least some of the light being of a wavelength which will pass through the four regions of the body and (4) at least one groove in the said other surface of the body, said groove being disposed directly below that portion of the said one surface not covered by the metal electrical contact whereby the light reaching said groove is reflected back into the body of the semiconductor material.

2. The device of claim 1 in which the at least one groove forms an angle of at least 16.5° to the normal.

3. The device of claim 2 in which the semiconductor material is silicon.

4. The device of claim 3 in which the metal electrical contacts are aluminum.

5. A semiconductor device comprising a body of semiconductive material having four regions of alternate type conductivity, the regions at the opposite ends of the body comprising emitters, at least one of the emitters projecting into a generally flat surface of the body, the two intermediate regions between the emitter region comprising base regions, means for directing light energy onto said flat surface portion of the at least one emitter to initiate conduction through the device, at least some of the light energy being of a wavelength which will pass entirely through the four regions of the body; and reflective means disposed on a surface of the body which is substantially parallel to said flat surface, whereby the light energy reaching said surface is reflected back into the body of semiconductor material.

6. The device of claim 5 in which the reflective means is at least one groove formed in the surface of the body.

7. The device of claim 5 in which the reflective means is a plurality of grooves formed in the surface of the body.

8. The device of claim 7 in which the semiconductor material is silicon and each of the grooves forms an angle of at least 16.5° with the normal.

9. The device of claim 8 in which the light energy is provided by a neodymium doped laser.